United States Patent
Yoon et al.

(10) Patent No.: US 9,263,180 B2
(45) Date of Patent: Feb. 16, 2016

(54) COIL COMPONENT AND BOARD HAVING THE SAME

(71) Applicant: SAMSUNG ELECTRO-MECHANICS CO., LTD., Suwon-Si, Gyeonggi-Do (KR)

(72) Inventors: Chan Yoon, Suwon-Si (KR); Dong Hwan Lee, Suwon-Si (KR); Tae Young Kim, Suwon-Si (KR)

(73) Assignee: SAMSUNG ELECTRO-MECHANICS CO., LTD., Suwon-Si, Gyoneggi-Do (KR)

( * ) Notice: Subject to any disclaimer, the term of this patent is extended or adjusted under 35 U.S.C. 154(b) by 112 days.

(21) Appl. No.: 14/256,558

(22) Filed: Apr. 18, 2014

(65) Prior Publication Data

US 2015/0047888 A1 Feb. 19, 2015

(30) Foreign Application Priority Data

Aug. 19, 2013 (KR) .......................... 10-2013-0097840

(51) Int. Cl.
| | |
|---|---|
| *H01F 5/00* | (2006.01) |
| *H01F 27/28* | (2006.01) |
| *H01L 27/08* | (2006.01) |
| *H01F 27/29* | (2006.01) |
| *H01F 17/00* | (2006.01) |
| *H05K 3/34* | (2006.01) |

(Continued)

(52) U.S. Cl.
CPC .......... *H01F 27/292* (2013.01); *H01F 17/0006* (2013.01); *H01F 27/324* (2013.01); *H01F 2017/0066* (2013.01); *H01F 2017/0073* (2013.01); *H01F 2017/048* (2013.01); *H05K 3/3442* (2013.01); *H05K 2201/1003* (2013.01)

(58) Field of Classification Search
CPC ... H01F 41/041; H01F 38/14; H01F 27/2804; H01L 2924/30107; H01L 23/645; H01L 23/5227; H01L 28/10
USPC ................... 336/200, 180, 181, 232; 257/531
See application file for complete search history.

(56) References Cited

U.S. PATENT DOCUMENTS

| | | | | | |
|---|---|---|---|---|---|
| 5,420,558 | A | * | 5/1995 | Ito | ........................ H01F 17/0006 336/200 |
| 5,572,179 | A | * | 11/1996 | Ito | ........................ H01F 17/0006 336/200 |
| 6,977,573 | B1 | * | 12/2005 | Maeda | .................... H01F 5/003 336/200 |

(Continued)

FOREIGN PATENT DOCUMENTS

KR   10-2005-0011090 A   1/2005

*Primary Examiner* — Alexander Talpalatski
*Assistant Examiner* — Joselito Baisa
(74) *Attorney, Agent, or Firm* — McDermott Will & Emery LLP

(57) ABSTRACT

A coil component may include: a magnetic body; and first and eighth external electrodes formed on one surface of the magnetic body, second and third external electrodes and sixth and seventh external electrodes that are formed on two surfaces adjacent to the one surface of the magnetic body, respectively, and fourth and fifth external electrodes formed on the other surface opposing the one surface of the magnetic body. The magnetic body includes upper and lower substrates and first to fourth coil parts disposed between the upper and lower substrates and enclosed by an insulation film, the first to fourth coil parts having coupled coils wound in parallel on the same plane, respectively, so that magnetic fluxes in the coupled coils are formed in directions opposite to each other, the coupled coils being composed of first to eighth coils.

18 Claims, 7 Drawing Sheets

(51) Int. Cl.
*H01F 27/32* (2006.01)
*H01F 17/04* (2006.01)

(56) References Cited

U.S. PATENT DOCUMENTS

| 7,696,849 | B2* | 4/2010 | Ito | H05K 3/3442 336/192 |
|---|---|---|---|---|
| 8,018,312 | B2* | 9/2011 | Kossel | H03H 7/185 331/117 R |
| 8,130,068 | B2* | 3/2012 | Mori | H01F 17/0013 336/200 |
| 8,344,841 | B2* | 1/2013 | Gertenbach | H01F 27/346 336/173 |
| 2011/0241663 | A1 | 10/2011 | Gleich | |

* cited by examiner

COIL COMPONENT AND BOARD HAVING THE SAME

CROSS-REFERENCE TO RELATED APPLICATION

This application claims the benefit of Korean Patent Application No. 10-2013-0097840 filed on Aug. 19, 2013, with the Korean Intellectual Property Office, the disclosure of which is incorporated herein by reference.

BACKGROUND

The present disclosure relates to a coil component and a board having the same, and more particularly, to a coil component in which magnetic fluxes may be negatively coupled to each other and the same coupling coefficient may be implemented, and a board having the same.

A data transmitting and receiving function of electronic products such as digital television sets (TV), smart phones, notebook computers, or the like, in a high frequency band has been widely used. In the future, these information technology (IT) electronic products are also expected to be frequently provided with multi-functionality and complex characteristics not only when used alone, but also when connected to another device via a universal serial bus (USB) or another communications port.

However, in order to rapidly transmit and receive data as described above, data are transmitted and received through many internal signal lines by changing a frequency band from a frequency band of MHz according to related art to a high frequency band of GHz.

At the time of transmitting and receiving signals in a high frequency band of GHz between a main device and a peripheral device in order to transmit and receive a large amount of data, there may be a problem in smoothly processing data due to delay of the signal and other interference. Particularly, in the case of digital TV, when communications signal lines, video signal lines, audio signal lines, and so on, are connected using various port-to-port methods, problems such as internal signal line delay and transmission and reception distortion may further frequently occur.

In order to solve these problems, electromagnetic interference (EMI) shielding components are arranged in the vicinity of connection regions between IT devices and peripheral devices.

As an existing EMI shielding component, a power inductor has been mainly used.

In accordance with the recent trend toward slimness, miniaturization, complex structures and multi-function of electronic products, EMI shielding components corresponding to this trend have been in demand.

Therefore, array-type power inductor products have been produced. However, in this case, there may be a ripple noise problem due to differences in magnetic fluxes and coupling coefficients between coils, such that electronic component efficiency may be decreased.

RELATED ART DOCUMENT

Korean Patent Laid-Open Publication No. 2005-0011090

SUMMARY

Some embodiments of the present disclosure may provide a coil component in which magnetic fluxes may be negatively coupled to each other and the same coupling coefficient thereof may be implemented, and a board having the same.

According to some embodiments of the present disclosure, a coil component may include: a magnetic bodymagnetic body; and first and eighth external electrodes formed on one surface of the magnetic bodymagnetic body, second and third external electrodes and sixth and seventh external electrodes that are formed on two surfaces adjacent to the one surface of the magnetic bodymagnetic body, respectively, and fourth and fifth external electrodes formed on the other surface opposing the one surface of the magnetic bodymagnetic body, wherein the magnetic bodymagnetic body includes upper and lower substrates and first to fourth coil parts disposed between the upper and lower substrates and enclosed by an insulation film, the first to fourth coil parts having coupled coils wound in parallel on the same plane, respectively, so that magnetic fluxes in the coupled coils are formed in directions opposite to each other, the coupled coils being composed of first to eighth coils, and the first to eighth coils being connected to the first to eighth external electrodes, respectively.

In the first to fourth coil parts, when distances between coil parts adjacent to one another are defined as d1 to d4, d1 to d4 may be the same as one another (d1=d2=d3=d4).

In the first to eighth coils, distances between centers of respective coils configuring the respective coupled coils may be the same as one another.

In the first to eighth coils, when distances between coils opposing each other based on the center of the magnetic bodymagnetic body and having magnetic fluxes formed in directions opposite to each other are defined as g1 to g4, g1 to g4 may be the same as one another (g1=g2=g3=g4).

A thickness of the magnetic bodymagnetic body may be 1.2 mm or less.

The first to eighth coils may have a polygonal, circular, oval, or irregular shape.

The first to eighth coils may contain one or more selected from a group consisting of gold, silver, platinum, copper, nickel, palladium, and alloys thereof.

The upper and lower substrates may be magnetic substrates.

The insulation film may contain a photosensitive polymer insulation material.

According to some embodiments of the present disclosure, a board having a coil component may include: a printed circuit board having a plurality of electrode pads formed thereon; and a coil component mounted on the printed circuit board, wherein the coil component includes a magnetic body, and first and eighth external electrodes formed on one surface of the magnetic body, second and third external electrodes and sixth and seventh external electrodes that are formed on two surfaces adjacent to the one surface of the magnetic body, respectively, and fourth and fifth external electrodes formed on the other surface opposing the one surface of the magnetic body, the magnetic body including upper and lower substrates and first to fourth coil parts disposed between the upper and lower substrates and enclosed by an insulation film, the first to fourth coil parts having coupled coils wound in parallel on the same plane, respectively, so that magnetic fluxes in the coupled coils are formed in directions opposite to each other, the coupled coils being composed of first to eighth coils, and the first to eighth coils being connected to the first to eighth external electrodes, respectively.

In the first to fourth coil parts, when distances between coil parts adjacent to one another are defined as d1 to d4, d1 to d4 may be the same as one another (d1=d2=d3=d4).

In the first to eighth coils, distances between centers of respective coils configuring the respective coupled coils may be the same as one another.

In the first to eighth coils, when distances between coils opposing each other based on the center of the magnetic body and having magnetic fluxes formed in directions opposite to each other are defined as g1 to g4, g1 to g4 may be the same as one another (g1=g2=g3=g4).

A thickness of the magnetic body may be 1.2 mm or less.

The first to eighth coils may have a polygonal, circular, oval, or irregular shape.

The first to eighth coils may contain one or more selected from a group consisting of gold, silver, platinum, copper, nickel, palladium, and alloys thereof.

The upper and lower substrates may be magnetic substrates.

The insulation film may contain a photosensitive polymer insulation material.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
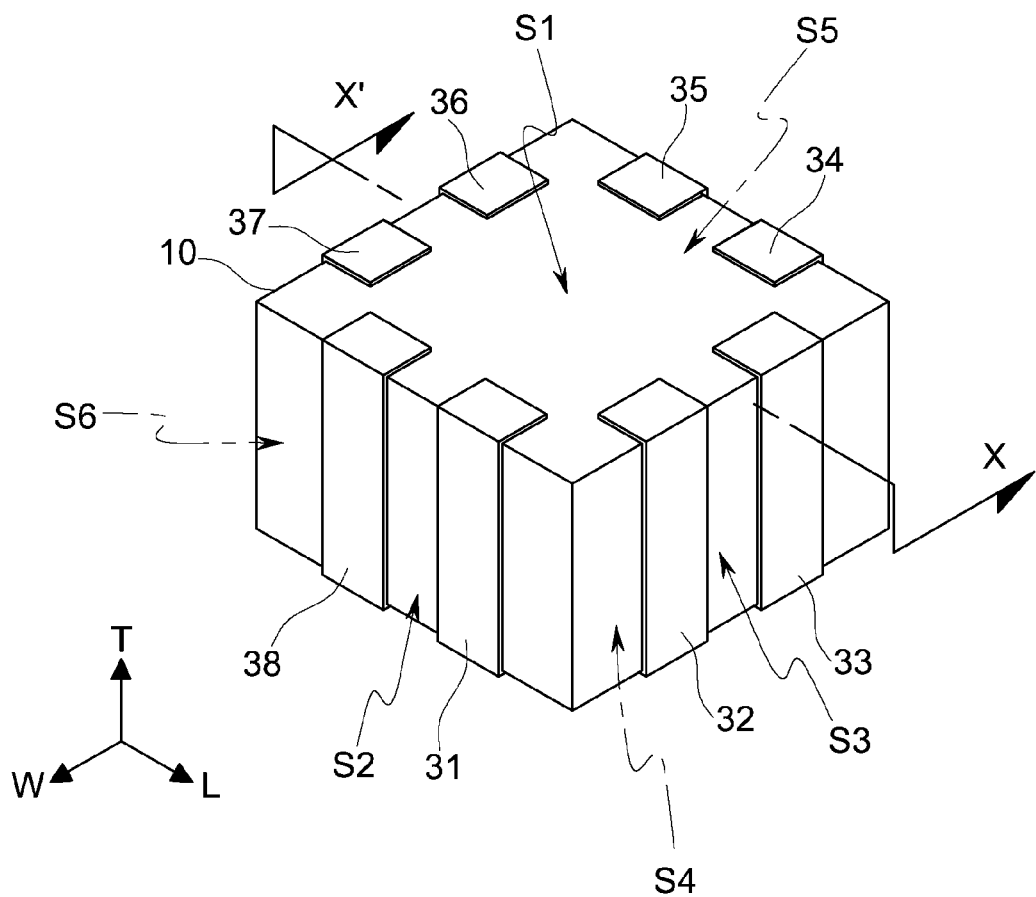
FIG. 1 is a perspective view of a coil component according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Coil Component

FIG. 1 is a perspective view of a coil component according to an exemplary embodiment of the present disclosure.

Figure 2:
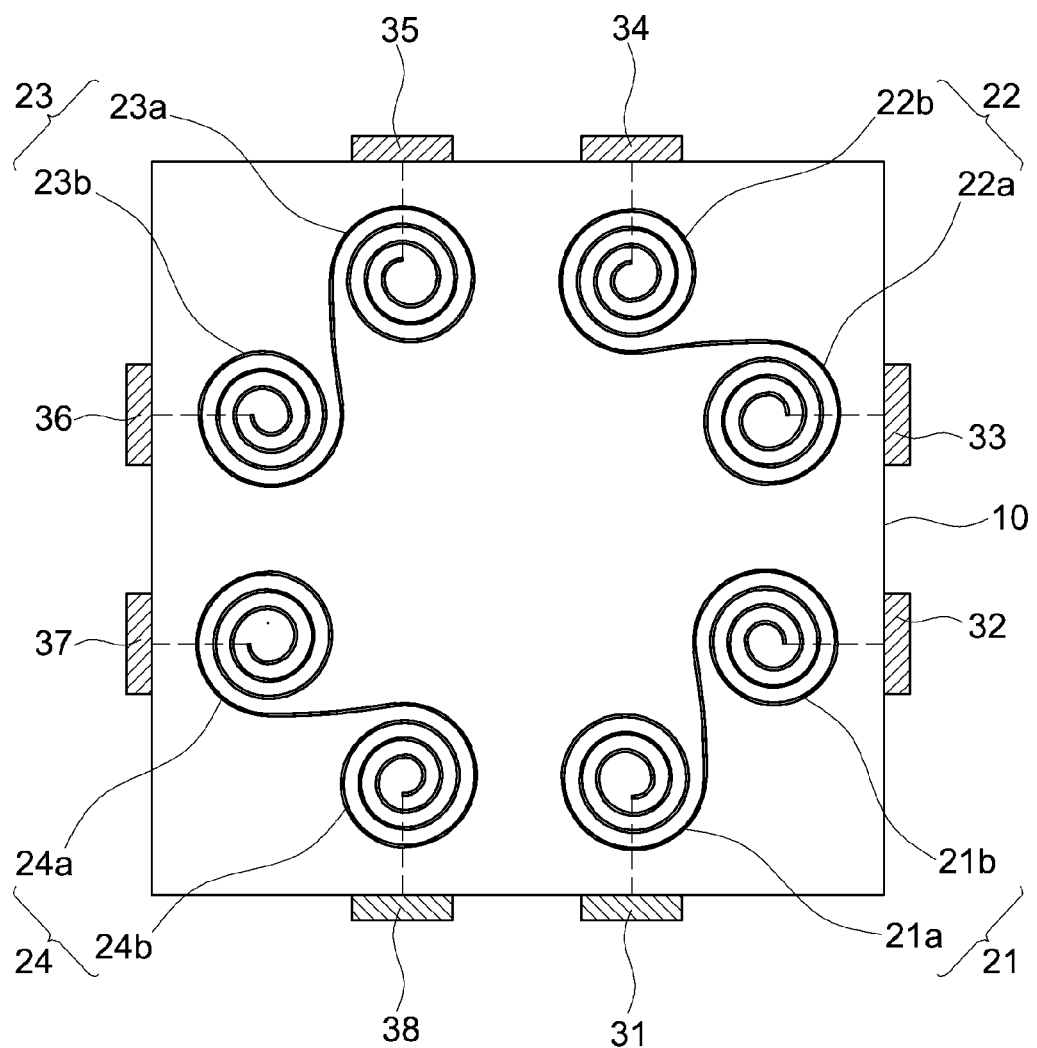
FIG. 2 is a plan view of FIG. 1.

FIG. 2 is a plan view of FIG. 1.

Figure 3:
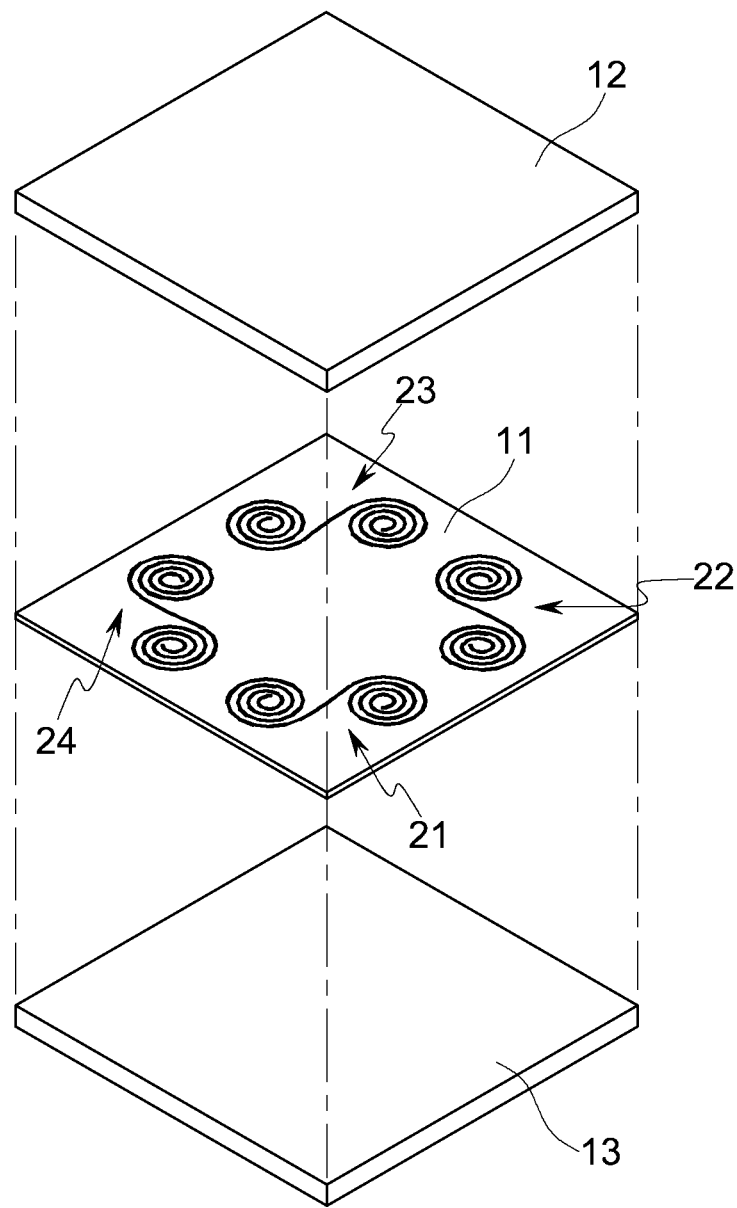
FIG. 3 is an exploded perspective view of FIG. 1.

FIG. 3 is an exploded perspective view of FIG. 1.

Figure 4:
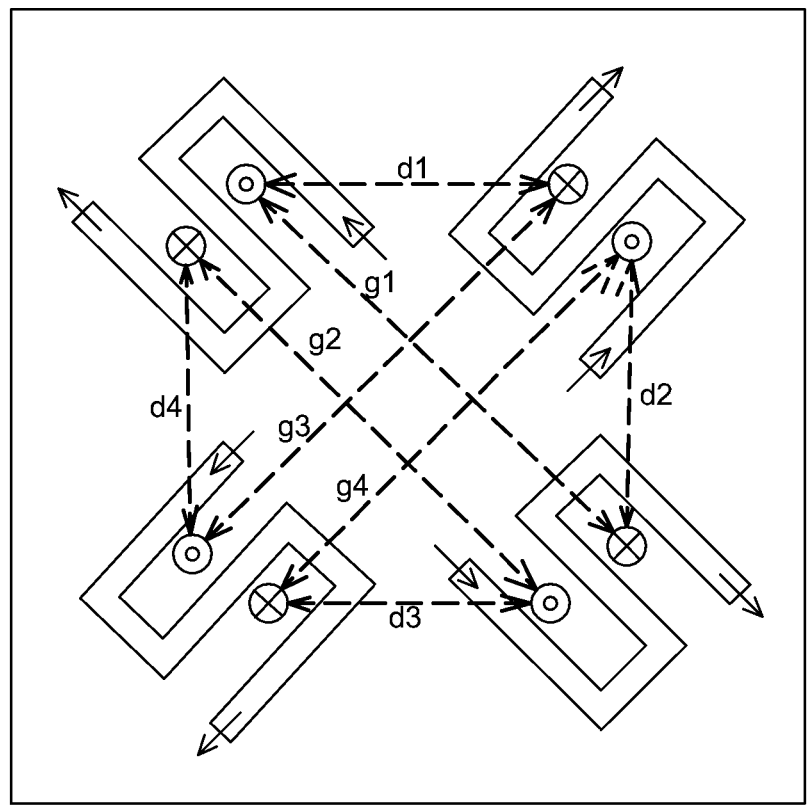
FIG. 4 is a view illustrating that a coil of the coil component according an exemplary embodiment of the present disclosure has a symmetrical structure.

FIG. 4 is a view illustrating that a coil of the coil component according an exemplary embodiment of the present disclosure has a symmetrical structure.

Figure 5:
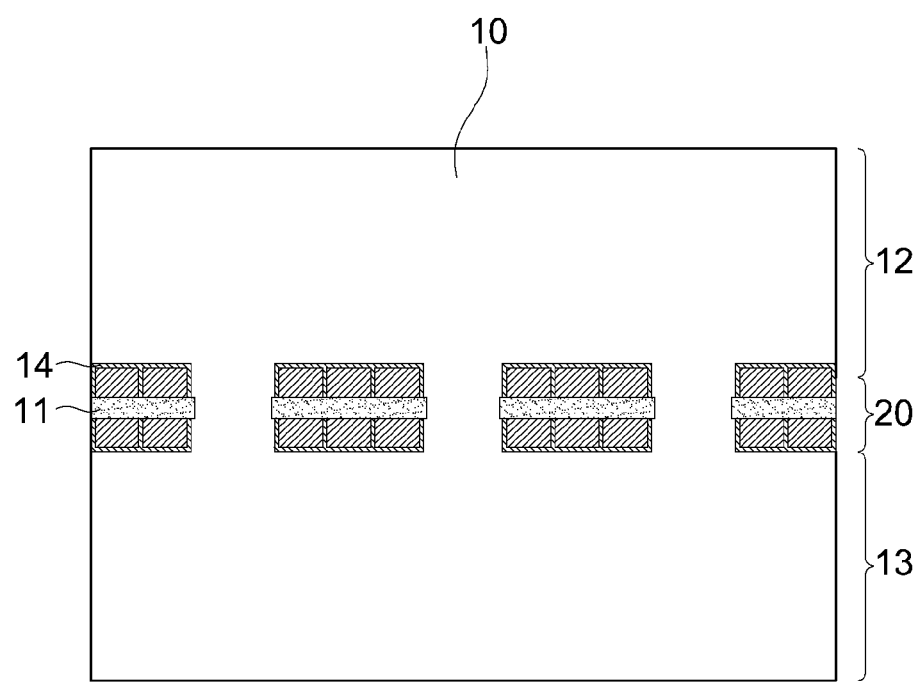
FIG. 5 is a cross-sectional view taken along line X-X' of FIG. 1.

FIG. 5 is a cross-sectional view taken along line X-X' of FIG. 1.

Referring to FIGS. 1 through 5, the coil component according to an exemplary embodiment of the present disclosure may include a magnetic body 10; and first and eighth external electrodes 31 and 38 formed on one surface of the magnetic body 10, second and third external electrodes 32 and 33 and sixth and seventh external electrodes 36 and 37 that are formed on two surfaces adjacent to the one surface of the magnetic body 10, respectively, and fourth and fifth external electrodes 34 and 35 formed on the other surface opposing the one surface of the magnetic body 10. The magnetic body 10 may include upper and lower substrates 12 and 13 and first to fourth coil parts 21 to 24 disposed between the upper and lower substrates 12 and 13 and enclosed by an insulation film 14, the first to fourth coil parts 21 to 24 having coupled coils 21a and 21b, 22a and 22b, 23a and 23b, and 24a and 24b that are wound in parallel on the same plane, respectively, so that magnetic fluxes in the coupled coils are formed in directions opposite to each other, the coupled coils 21a and 21b, 22a and 22b, 23a and 23b, and 24a and 24b being composed of first to eighth coils 21a, 21b, 22a, 22b, 23a, 23b, 24a, and 24b, and the first to eighth coils 21a, 21b, 22a, 22b, 23a, 23b, 24a, and 24b being connected to the first to eighth external electrodes 31 to 38, respectively.

In this exemplary embodiment, the terms "first to eighth" are only to distinguish the elements from each other and are not limited to the sequence.

The magnetic body 10 may be a hexahedron. Here, an "L direction" refers to a "length direction", a "W direction" refers to a "width direction", and a "T direction" refers to a "thickness direction".

The magnetic body 10 may include the upper substrate 12, the lower substrate 13, and the first to fourth coil parts 21 to 24 disposed between the upper and lower substrates 12 and 13 and enclosed by the insulation film 14.

Hereinafter, the first to fourth coil parts 21 to 24 and the first to eighth external electrodes 31 to 38 will be described with reference to FIGS. 1 through 3.

The first to fourth coil parts 21 to 24 may have coupled coils 21a and 21b, 22a and 22b, 23a and 23b, and 24a and 24b that are wound in parallel on the same plane, respectively, so that the magnetic fluxes thereof are formed in directions opposite to each other, the coupled coils 21a and 21b, 22a and 22b, 23a and 23b, and 24a and 24b may be composed of first to eighth coils 21a, 21b, 22a, 22b, 23a, 23b, 24a, and 24b.

For example, the first coil part 21 may have a coupled coil form composed of the first and second coils 21a and 21b wound in parallel on the same plane so that the magnetic fluxes thereof are formed in directions opposite to each other.

In addition, the second to fourth coil parts 22 to 24 may have a coupled coil shape (sequentially 22a and 22b, 23a and 23b, and 24a and 24b) composed of the third to eighth coils 22a, 22b, 23a, 23b, 24a, and 24b that are wound in parallel on the same plane, respectively, so that the magnetic fluxes thereof are formed in directions opposite to each other, in the manner similar to the first coil part 21.

In the first to eighth coils 21a, 21b, 22a, 22b, 23a, 23b, 24a, and 24b, distances between centers of respective coils configuring respective coupled coils may be the same as one another.

The first coil part 21, a coupled coil, may be composed of the first and second coils 21a and 21b, and the first and second coils are wound in directions opposite to each other, such that magnetic fluxes in the coils may be formed in directions opposite to each other.

For example, since distances between the first coils and the second coils are the same as one another, the opposite magnetic fluxes thereof may be negatively coupled to each other.

For example, since the first and second coils are wound in directions opposite to each other, when current flows in the first and second coils, magnetic fluxes formed in directions opposite to each other may be generated, and the magnetic fluxes generated between the coils having the same size and the same distance therebetween may be negatively coupled to each other.

This feature that the magnetic fluxes may be negatively coupled to each other may be provided in the second to fourth coil parts 22 to 24, similarly to that of the first coil part 21.

In addition, as described below, since in the first to fourth coil parts 21 to 24, distances between coil parts adjacent to each other may be the same as each other, and in the first to eighth coils 21a, 21b, 22a, 22b, 23a, 23b, 24a, and 24b, distances between coils opposing each other based on the center of the magnetic body 10 are the same as each other, the coupling coefficients thereof may be the same as each other.

Since the coupling coefficients thereof are the same as each other, ripple noise may be decreased, such that efficiency of the electronic component may be improved.

Features that the magnetic fluxes thereof are negatively coupled to each other and the coupling coefficients are the same as each other will be described below in detail.

The first to eighth coils 21a, 21b, 22a, 22b, 23a, 23b, 24a, and 24b may contain one or more selected from a group consisting of gold, silver, platinum, copper, nickel, palladium, and alloys thereof.

The first to eighth coils 21a, 21b, 22a, 22b, 23a, 23b, 24a, and 24b may be formed using any material as long as the material may impart conductivity to the coils, and the material of the coil parts is not limited to these metals.

Further, the first to eighth coils 21a, 21b, 22a, 22b, 23a, 23b, 24a, and 24b may have a polygonal, circular, oval, or irregular shape, and the shape is not particularly limited.

The first to eighth coils 21a, 21b, 22a, 22b, 23a, 23b, 24a, and 24b may be connected to the first to eighth external electrodes 31 to 38 through lead terminals (not shown), respectively.

Referring to FIGS. 1 and 2, the first and second coils 21a and 21b of the first coil part 21 may be connected to the first and second external electrodes 31 and 32, the third and fourth coils 22a and 22b of the second coil part 22 may be connected to the third and fourth external electrodes 33 and 34.

Similarly, the fifth and sixth coils 23a and 23b of the third coil part 23 may be connected to the fifth and sixth external electrodes 35 and 36, the seventh and eighth coils 24a and 24b of the fourth coil part 24 may be connected to the seventh and eighth external electrodes 37 and 38.

Among the first to fourth coil parts 21 to 24, coils of coil parts adjacent to each other may be wound in directions opposite to each other.

Referring to FIGS. 1 and 2, in the case of the first coil 21a of the first coil part 21, the first coil 21a may be wound in a counter clockwise direction outwardly from the core, but the second coil 21b thereof may be wound in clockwise direction inwardly toward the core.

Therefore, directions of the magnetic fluxes generated due to current flowing in the coil may become opposite to each other.

Such a feature may be similarly applied to the second to fourth coil parts 22 to 24.

The external electrode may include the first to eighth external electrodes 31 to 38.

The first and eighth external electrodes 31 and 38 may be formed on one surface S2 of the magnetic body 10, the second and third external electrodes 32 and 33 and the sixth and seventh external electrodes 36 and 37 may be formed on two surfaces S3 and S6 adjacent to the one surface S2 of the magnetic body 10, respectively, and the fourth and fifth external electrodes 34 and 35 may be formed on a surface S5 opposing the one surface S2 of the magnetic body 10.

Although the case in which eight external electrodes are formed is shown in FIGS. 1 and 2, but the present disclosure is not necessarily limited thereto.

The first to eighth external electrodes 31 to 38 may be extended in the thickness direction ("T direction") of the magnetic body 10.

The first to eighth external electrodes 31 to 38 may be disposed so as to be spaced apart from each other to thereby be electrically separated from each other.

The first to eighth external electrodes 31 to 38 may be extended to portions of upper and lower surfaces S1 and S4 of the magnetic body 10.

Since bonding portions between the first to eighth external electrodes 31 to 38 and the magnetic body 10 have angled portions, adhesive force between the first to eighth external electrodes 31 to 38 and the magnetic body 10 may be improved, and performance of enduring external impacts, or the like, may be improved.

A metal configuring the first to eighth external electrodes 31 to 38 is not particularly limited as long as the metal may impart electric conductivity to the first to eighth external electrodes 31 to 38.

In further detail, the first to eighth external electrodes 31 to 38 may contain one or more selected from a group consisting of gold, silver, platinum, copper, nickel, palladium, and alloys thereof.

Gold, silver, platinum, and palladium are expensive but have an advantage in that they are stable, while copper and nickel are cheap but have a disadvantage in that they may be oxidized during a sintering process to thereby decrease electric conductivity.

The first to eighth external electrodes 31 to 38 may alternately have different polarities.

For example, the first, third, fifth, and seventh external electrodes may have a positive (+) polarity, and remaining external electrodes may have a negative (−) polarity, but the present disclosure is not necessarily limited thereto.

A thickness of the magnetic body of the coil component according to an exemplary embodiment of the present disclosure may be 1.2 mm or less, but is not limited thereto. The magnetic body may be manufactured to have various thicknesses.

Referring to FIG. 4, in the case of the first to fourth coil parts 21 to 24, when distances between coil parts adjacent to one another are defined as d1 to d4, d1 to d4 may be the same as one another (d1=d2=d3=d4).

For example, since in the first to fourth coil parts 21 to 24, the distances between the coil parts adjacent to one another are the same as one another, the coupling coefficients thereof may be the same as one another.

Since the coupling coefficients are the same as one another, ripple noise may be decreased, such that efficiency of the electronic component may be improved.

Further, in the first to eighth coils 21a, 21b, 22a, 22b, 23a, 23b, 24a, and 24b, when distances between coils opposing each other based on the center of the magnetic body 10 and having magnetic fluxes formed in directions opposite to each other are defined as g1 to g4, g1 to g4 may be the same as one another (g1=g2=g3=g4).

For example, in the first to eighth coils 21a, 21b, 22a, 22b, 23a, 23b, 24a, and 24b, since the distances between coils opposing each other based on the center of the magnetic body 10 and having magnetic fluxes formed in directions opposite to each other are the same as one another, the coupling coefficients thereof may be the same as one another.

Since the coupling coefficients are the same as one another, ripple noise may be decreased, such that efficiency of the electronic component may be improved.

Referring to FIG. 5, the upper and lower substrates 12 and 13 may be magnetic substrates, and the magnetic substrate may contain nickel-zinc-copper ferrite.

In FIG. 5, the insulation film 14 may contain a photosensitive polymer insulation material. In addition, a photosensitive insulation material may be interposed between coil layers 20 adjacent to each other, and the adjacent coil layers 20 may be connected to each other by via holes.

In order to form the first to fourth coil parts 21 to 24 enclosed by the insulation film 14 between the upper and lower substrates 12 and 13, the first to fourth coil parts 21 to 24 may be formed on both surfaces of an insulation substrate 11.

Upper and lower coil layers 20 may be formed so as to be connected to each other by via conductors.

Figure 6:
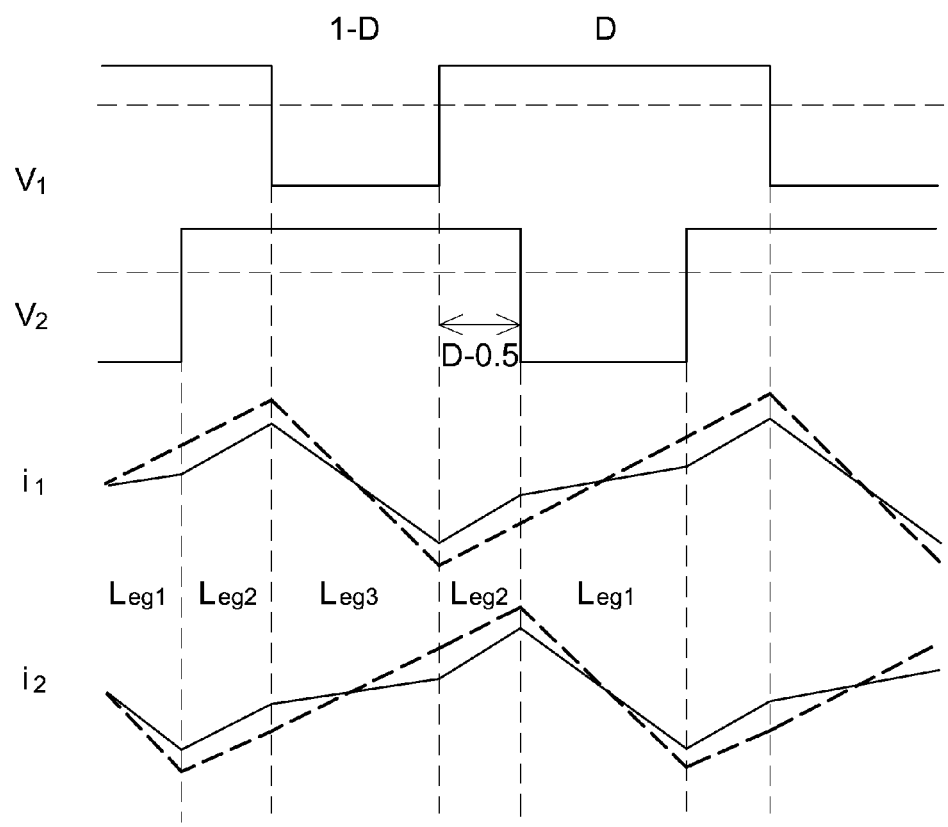
FIG. 6 is a graph illustrating waveforms of voltage and current according to Inventive Example and Comparative Example.

FIG. 6 is a graph illustrating waveforms of voltage and current according to Inventive Example and Comparative Example.

In FIG. 6, Inventive Example in which coils were disposed according to an exemplary embodiment of the present disclosure so that magnetic fluxes were negatively coupled to each other and the coupling coefficients thereof were the same as each other is represented by a solid line, and Comparative Example in which magnetic fluxes were not negatively coupled to each other is represented by a dotted line.

Referring to FIG. 6, it may be appreciated that in Inventive Example in which coils were disposed according to an exemplary embodiment of the present disclosure so that the magnetic fluxes were negatively coupled to each other and the coupling coefficients were the same as each other, current ripple was relatively small in a normal state, and accordingly, a loss was decreased, such that efficiency of the coil component was further excellent as compared to Comparative Example in which the magnetic fluxes were not negatively coupled to each other.

Board Having Coil Component

Figure 7:
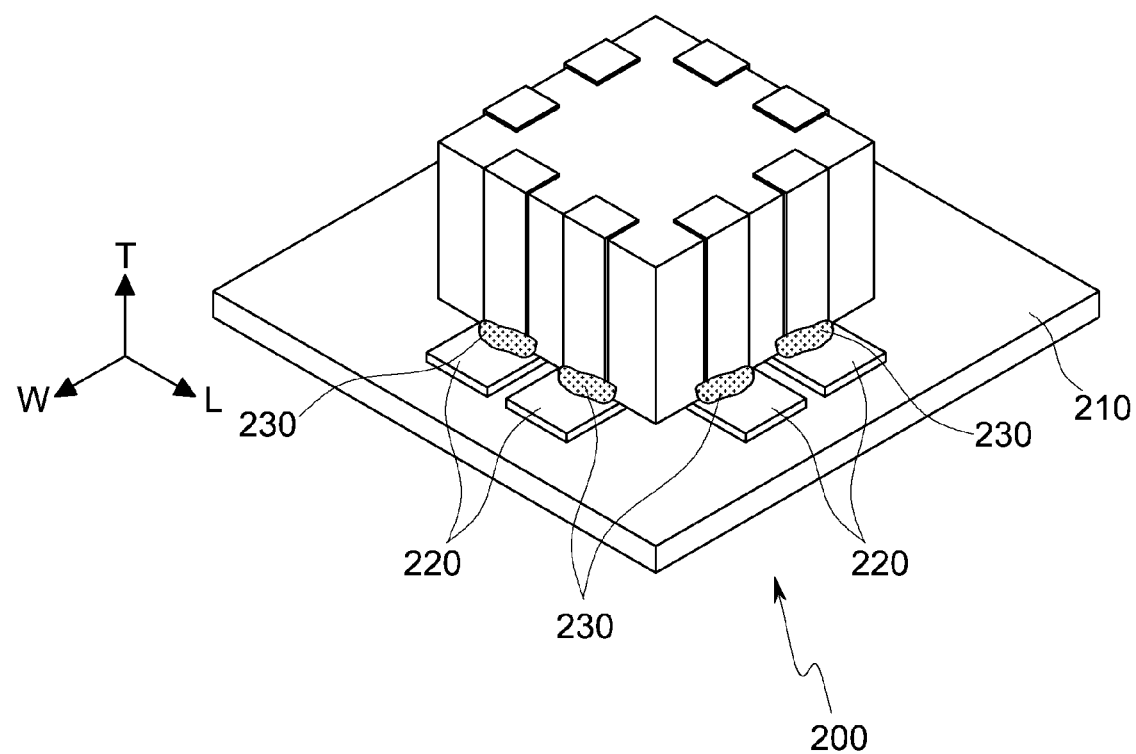
FIG. 7 is a perspective view illustrating a form in which the coil component of FIG. 1 is mounted on a printed circuit board.

FIG. 7 is a perspective view illustrating a form in which the coil component of FIG. 1 is mounted on a printed circuit board.

Referring to FIG. 7, the board 200 having a coil component according to the exemplary embodiment of the present disclosure may include a printed circuit board 210 on which the coil component is horizontally mounted, and a plurality of electrode pads 220 formed on the printed circuit board so as to be spaced apart from each other.

The coil component may be electrically connected to the printed circuit board 210 through a soldering 230 in a state in which first to eighth external electrodes 31 to 38 are positioned on the electrode pads 220, respectively, so as to contact each other.

Except for this description, a description of features overlapped with those of the coil component according to the foregoing embodiment of the present disclosure will be omitted.

According to exemplary embodiments of the present disclosure, since the magnetic fluxes may be negatively coupled to each other, and the same coupling coefficients may be implemented, the coil component capable of decreasing the loss and having excellent efficiency and the board having the same may be obtained.

While exemplary embodiments have been shown and described above, it will be apparent to those skilled in the art that modifications and variations could be made without departing from the spirit and scope of the present disclosure as defined by the appended claims.

What is claimed is:

1. A coil component comprising:
   a magnetic body; and
   first and eighth external electrodes disposed on one surface of the magnetic body, second and third external electrodes and sixth and seventh external electrodes that are disposed on two surfaces adjacent to the one surface of the magnetic body, respectively, and fourth and fifth external electrodes disposed on the other surface opposing the one surface of the magnetic body,
   wherein the magnetic body includes upper and lower substrates and first to fourth coil parts disposed between the upper and lower substrates and enclosed by an insulation film, the first to fourth coil parts having coupled coils wound in parallel on the same plane, respectively, so that magnetic fluxes in the coupled coils are formed in directions opposite to each other, the coupled coils being composed of first to eighth coils, and the first to eighth coils being connected to the first to eighth external electrodes, respectively.

2. The coil component of claim 1, wherein in the first to fourth coil parts, when distances between coil parts adjacent to one another are defined as d1 to d4, d1 to d4 are the same as one another (d1=d2=d3=d4).

3. The coil component of claim 1, wherein in the first to eighth coils, distances between centers of respective coils configuring the respective coupled coils are the same as one another.

4. The coil component of claim 1, wherein in the first to eighth coils, when distances between coils opposing each other based on the center of the magnetic body and having magnetic fluxes formed in directions opposite to each other are defined as g1 to g4, g1 to g4 are the same as one another (g1=g2=g3=g4).

5. The coil component of claim 1, wherein a thickness of the magnetic body is 1.2 mm or less.

6. The coil component of claim 1, wherein the first to eighth coils have a polygonal, circular, oval, or irregular shape.

7. The coil component of claim 1, wherein the first to eighth coils contain one or more selected from a group consisting of gold, silver, platinum, copper, nickel, palladium, and alloys thereof.

8. The coil component of claim 1, wherein the upper and lower substrates are magnetic substrates.

9. The coil component of claim 1, wherein the insulation film contains a photosensitive polymer insulation material.

10. A board having a coil component, the board comprising:
    a printed circuit board having a plurality of electrode pads formed thereon; and
    a coil component mounted on the printed circuit board,
    wherein the coil component includes a magnetic body, and first and eighth external electrodes formed on one surface of the magnetic body, second and third external electrodes and sixth and seventh external electrodes that are formed on two surfaces adjacent to the one surface of the magnetic body, respectively, and fourth and fifth external electrodes formed on the other surface opposing the one surface of the magnetic body, the magnetic body including upper and lower substrates and first to fourth coil parts disposed between the upper and lower substrates and enclosed by an insulation film, the first to fourth coil parts having coupled coils wound in parallel on the same plane, respectively, so that magnetic fluxes in the coupled coils are formed in directions opposite to each other, the coupled coils being composed of first to eighth coils, and the first to eighth coils being connected to the first to eighth external electrodes, respectively.

11. The board of claim 10, wherein in the first to fourth coil parts, when distances between coil parts adjacent to one another are defined as d1 to d4, d1 to d4 are the same as one another (d1=d2=d3=d4).

12. The board of claim 10, wherein in the first to eighth coils, distances between the centers of respective coils configuring the respective coupled coils are the same as one another.

13. The board of claim 10, wherein in the first to eighth coils, when distances between coils opposing each other based on the center of the magnetic body and having magnetic fluxes formed in directions opposite to each other are defined as g1 to g4, g1 to g4 are the same as one another (g1=g2=g3=g4).

14. The board of claim 10, wherein a thickness of the magnetic body is 1.2 mm or less.

15. The board of claim 10, wherein the first to eighth coils have a polygonal, circular, oval, or irregular shape.

16. The board of claim 10, wherein the first to eighth coils contain one or more selected from a group consisting of gold, silver, platinum, copper, nickel, palladium, and alloys thereof.

17. The board of claim 10, wherein the upper and lower substrates are magnetic substrates.

18. The board of claim 10, wherein the insulation film contains a photosensitive polymer insulation material.

\* \* \* \* \*